Dec. 14, 1965 P. L. CLAR 3,223,947

BROADBAND SINGLE POLE MULTI-THROW DIODE SWITCH WITH FILTER PROVIDING MATCHED PATH BETWEEN INPUT AND ON PORT

Filed Sept. 11, 1963 2 Sheets-Sheet 1

INVENTOR.
Philip L. Clar
BY Mueller & Aichele
Attys.

INVENTOR.
Philip L. Clar
BY Mueller & Aichele
Attys.

United States Patent Office 3,223,947

Patented Dec. 14, 1965

3,223,947

BROADBAND SINGLE POLE MULTI-THROW DIODE SWITCH WITH FILTER PROVIDING MATCHED PATH BETWEEN INPUT AND ON PORT

Philip L. Clar, Phoenix, Ariz., assignor to Motorola, Inc., Chicago, Ill., a corporation of Illinois Filed Sept. 11, 1963, Ser. No. 308,286
9 Claims. (Cl. 333—7)

This invention relates to electronic switching arrangements and in particular to multi-throw diode switches particularly useful in high frequency switching applications.

There is an increasing number of instances where it is desirable to utilize multi-throw switches at frequencies in the VHF, UHF and microwave regions. For example, such switches find use in microwave computers, RF channel sampling systems, and in signal processing antenna systems. Among the primary requirements for high frequency switches for these and other applications is that they have a low input standing wave ratio, introduce low insertion loss into the system, and at the same time provide maximum circuit isolation, all over a broad frequency band. It is also desirable that they operate at high switching speeds and consume low operating power, be compact and light weight, and preferably involve no mechanical movement.

It has been recognized that biased diode switching arrangements can be utilized to provide high operating speeds with low power consumption, while at the same time presenting certain mechanical advantages over their ferromagnetic and mechanical counter parts. However, the complex impedances introduced into a system by diodes at high frequencies may result in a mis-match that adds insertion loss and increases the standing wave ratio of the system, and provides only limited circuit isolation. For example, the series inductance and shunt capacitance of a diode represents parasitic impedance elements of no useful circuit consequence and may, in fact, present serious matching problems for any but the narrowest band of frequencies. As a consequence, known prior art biased diode multi-pole switching arrangement have found only limited applications and versatility in high frequency systems.

It is therefore among the objects of this invention to provide a multi-pole diode switching arrangement having improved broadband performance at high frequencies.

Another object is to provide a 1:N multi-throw diode switch having high circuit isolation, low insertion loss and low input voltage standing wave ratio from D.C. up to frequencies in the microwave region.

A further object is to provide an improved fast-acting, low power, broadband single pole multi-throw diode switch which is simple to fabricate and extremely reliable in operation.

A feature of the invention is the provision of a single pole, multi-throw diode switch wherein the series inductance of a selected forward biased diode and shunt capacitance of a plurality of reverse biased diodes is incorporated with impedance matching elements of a transmission line to provide a filter network that allows broadband matching of the selected forward biased diode in the signal propagation path.

Another feature of the invention is the provision of a single pole multi-throw diode switch having N diodes coupled between N output ports and a common junction. Radio frequency energy coupled to the common junction via an input port is propagated through a selected forward bias diode to its associated output port. The remaining N–1 diodes are reversed biased and their shunt capacitance is incorporated with the series inductance of the forward biased diode to provide elements of a filter network to insure a broadband matched path between the input port and the selected output port.

A further feature of the invention is the provision of a single pole multi-throw diode switching arrangement wherein the series inductance of the "on" diode and the shunt capacitance of the "off" diodes are incorporated into a low pass filter network for impedance matching of the "on" diode between its input and outputs ports. There is accordingly a low loss matched path between input and output ports of the switch for all frequencies up to the cutoff frequency of the low pass filter.

A still further feature of the invention is the provision of a diode switching arrangement of the above described type wherein the series inductance of the "on" diode and shunt capacitance of the "off" diodes are incorporated into a band pass filter network for impedance matching of the "on" diode between input and output ports. There is accordingly a matched low impedance propagation path between the input and output ports for all frequencies within pass band of the filter network.

Other objects, features and attending advantages of the invention will become apparent from the following description when taken in conjunction with the accompanying drawings in which.

In practicing the invention there is provided a single pole, multi-throw diode switching arrangement wherein N crystal diodes are coupled between N ports and a common junction point. The common junction point is further connected to a common port. As is understood in the art such diodes function as a high speed radio-frequency switch by virtue of impedance changes effected by a direct current bias applied thereto. Generally a forward bias allows propagation of RF energy while a reverse bias reflects RF energy. The impedance characteristics of such diodes are bi-directional or reciprocal to RF energy. Accordingly, the N ports may be considered either input or output ports, and correspondingly the common port may be considered as an output or input port. For convenience of nomenclature in the following description the N ports will be taken as output ports and the common port as an input port.

Typically the diodes may be connected in series with the center conductor of a suitable coaxial or strip line structure, with each diode terminating at the common junction point. The common junction point is further connected to the common port of the switch by a high impedance matching section of line to provide an effective series inductance to be incorporated as one leg of a filter network as hereinafter described. The diodes are individually provided with a D.C. biasing voltage so that a selected one may be forward biased, with the remaining ones reversed biased. The forward biased diode provides a low impedance path between the common port and an associated Nth port, with the reverse biased diodes presenting a high impedance path for circuit isolation of the remaining N—1 ports. Thus, by selective biasing of the diodes it is possible to couple radio frequency energy between the common port and the selected port so that single pole multi-throw switching is achieved.

The shunt capacity of the N−1 reverse biased diodes and the series inductance of the Nth forward biased diode are combined with the above-mentioned matching section to provide a filter network which functions to match the common or input port of the switch to a selected output port associated with the forward biased diode. The filter network may be a low pass filter or a band pass filter, and allows energy to be propagated between the common port and a selected output port with a minimum of insertion loss and with a low VSWR over a wide frequency band. For example, in the instance of a low pass filter, matching is provided for all frequencies substantially up to the cutoff frequency of the filter while in the instance of the bandpass filter matching is provided for all frequencies within a specified pass band of the filter.

Figure 1:
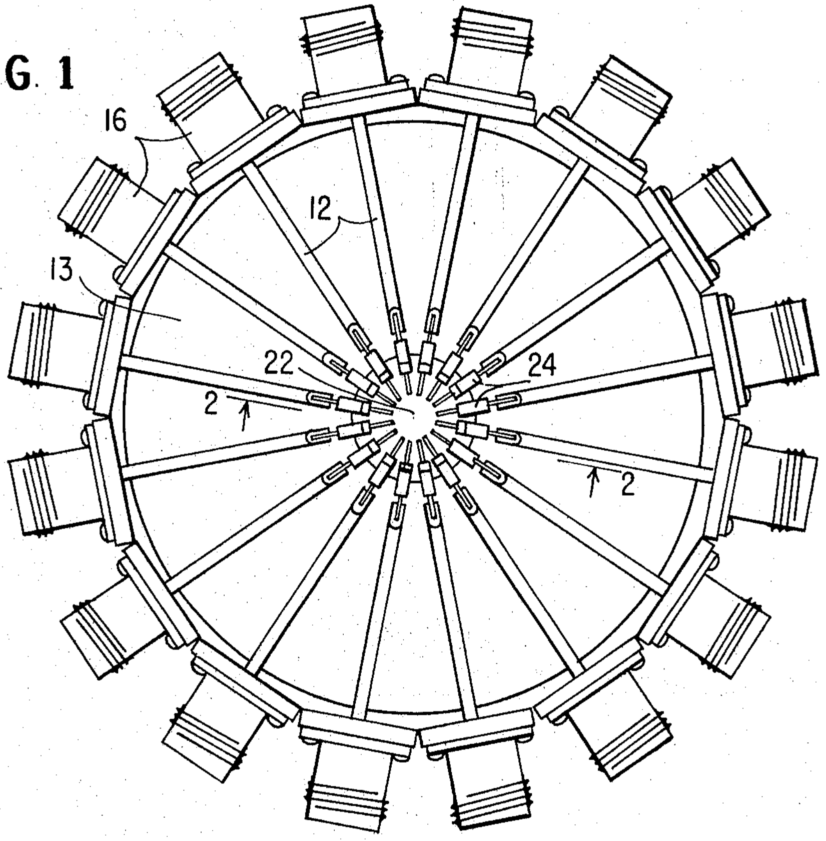
FIG. 1 is a plane view of a single pole, 16 throw switch which embodies the invention.
Figure 2:
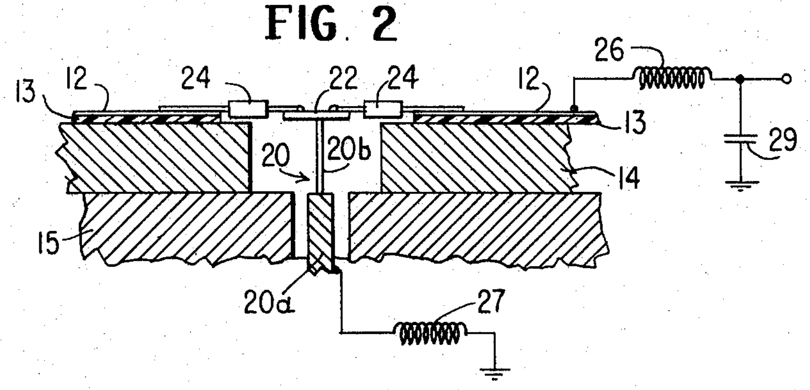
FIG. 2 is a sectional view on lines 2—2 of FIG. 1.

Referring now to FIGS. 1 and 2, there is shown one structural form of a single pole, 16 throw switch embodying the invention. For convenience of fabrication, the switch may be constructed utilizing known strip line techniques as shown in FIGS. 1 and 2. It is to be understood, however, that equivalent coaxial and related types of structure may also be utilized. In FIGS. 1 and 2 a plurality of conductors 12 are insulated from a metallic ground plane 14 by a suitable insulating sheet 13. Insulating sheet 13 is generally circular in shape and may be of low loss dielectric material. Conductors 12 are disposed thereon so that they extend radially from the center portion of insulating sheet 13 to its outer periphery in a pattern resembling the spokes of a wheel. The plurality of coaxial connectors 16 are disposed around the outer periphery of ground plane 14 and positioned so that their center conductors may be conveniently joined with conducting members 12, as by soldering. Ground plane 14 is supported by a metallic base plate 15. An additional metallic cover plate (not shown) is positioned above insulating sheet 13 and conductors 12, and spaced therefrom to allow propagation by conductors 12 in the TEM mode.

Coaxial apertures of different diameter are provided in the center of ground plane 14 and base plate 15, with center conductor 20 extending therethrough to form a section of coaxial line. The upper portion of center conductor 20 is terminated by disc shaped member 22 to provide a pedestal-like structure. The other end of coaxial line 20 may be terminated in a suitable coaxial connector (not shown) to provide the common or input port of the switch structure. Crystal diodes 24 are in turn connected between disc 22 and respective ones of conductors 12. Thus disc 22 forms a common terminal for one end of all of the diodes of the switch, with the other end of each diode being connected to individual ones of conductors 12 to complete a circuit to selected coaxial connectors 16 when selectively biased in the forward direction.

As best can be seen in FIG. 2, center conductor 20 includes sections **20*a* and 20*b*. Section 20*a* in conjunction with the coaxial aperture in base plate 15, is suitably dimensioned to provide a section of coaxial line having the same characteristic impedance as may be provided for the associated interconnecting cable used with the input port of the switch. Typically this may be 50 ohms. It will be noted that section 20*b* is of reduced diameter, while its associated aperture in ground plane 14 is of increased diameter. Accordingly section 20*b*** is a high impedance matching section which provides an effective inductive impedance in the circuit for the frequencies at which the switch is to be operated. It may be considered, for example, as the series inductance of a half section of a low pass filter. Filter design considerations for transmission lines are set forth in "Very High Frequency Techniques," vol. 2, Chapter 27, Radio Research Laboratories Staff, McGraw-Hill Book Company, Inc., 1947. If desired, additional filter sections may be incorporated by utilizing known transmission-line filter techniques.

It is to be understood that a D.C. biasing source is to be supplied to normally provide reverse biasing for each of diodes 24, with a switching arrangement to bias selected ones of diodes 24 in a forward direction. A number of well known types of electronic switching circuits may be employed, as for example, a plurality of multivibrators with appropriate triggering means to selectively apply the necessary biasing to individual diodes 24. Details of such circuits form no part of the invention. For purposes of illustration, there is shown a D.C. biasing current path for one such diode, which path includes inductors 26 and 27. A D.C. voltage of suitable polarity is connected through choke inductor 26 to a selected one of conductors 12 and hence to diode 24. A current return path is provided by choke inductor 27, connected between center conductor 20 and ground reference potential. One such choke inductor 26 may be provided for each conductor 12, while inductor 27 provides a common return for all diodes. The only critical requirement for inductors 26 and 27 is that they not be self-resonant over the band of frequencies of interest. Capacitor 29 may be further utilized to provide RF bypass and isolation of the D.C. supply.

Figures 3, 4, 5:
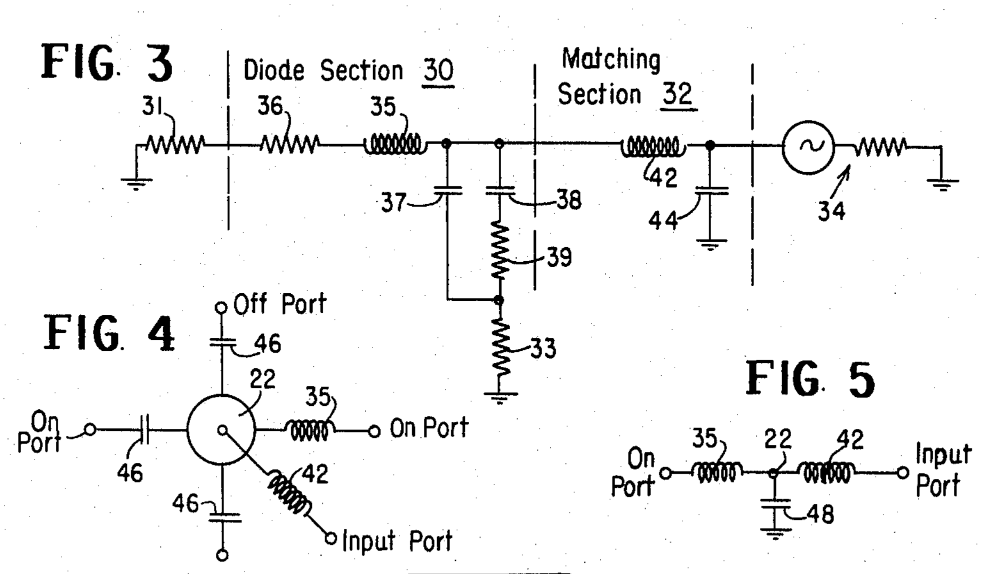
FIG. 3 is an equivalent circuit of a multi-pole diode switch illustrative of the invention.
FIGS. 4 and 5 are equivalent circuits of a single pole, 4 throw diode switch showing the manner in which the diode capacitance and inductance are incorporated into a low pass filter.

The equivalent circuit of a crystal diode at high frequencies includes the series circuit of whisker inductance $L_w$, series resistance $R_s$, and zero bias junction capacity $C_j$, all shunted by the diode case capacity $C_p$. When the diode is forward biased the junction capacity is effectively eliminated, and is a function of bias voltage when reverse bias is applied. It is desirable to utilize the diode in its normal or D.C. mode, and for satisfactory operation as a switch in this mode the following conditions should be met:

(1) $|X_{C_p}| \gg |X_{L_w}|$ to prevent parallel resonance (2) $|X_{C_j}| \gg |X_{L_w}|$ to prevent series resonance (3) $|X_{C_j}+C_p| \gg |X_{L_w}+R_s|$ for switching action With reference now to FIG. 3, there is shown an equivalent circuit based on the above considerations for the switching arrangement illustrated in FIGS. 1 and 2. The equivalent circuit is divided into diode section 30 and matching section 32. Resistor 31 represents the load for the "on" diode, while resistor 33 represents the load of all of the "off" diodes. The driving source or input signal is shown at 34. Assuming an N throw switch with N diodes, one diode is forward biased and the remaining diodes reverse biased. The equivalent circuit of the forward biased diode is represented by its series inductance 35 and series resistance 36. This circuit is returned to ground through load resistance 31. The equivalent circuit of the reverse biased diodes, which may be considered the combination of N—1 diodes connected in parallel, and includes diode case capacity 37, junction capacity 38, and diode series resistance 39. This combination is in turn returned to ground reference potential through equivalent load resistance 33 which may be considered small for a large number of diodes in parallel. Matching section 32 includes series inductance 42 and shunt capacitance 44, which elements represent sections of the coaxial line filter provided by sections **20*a* and 20*b* of center conductor 20**.

The manner in which the series inductance of the forward biased diode and the shunt capacitance of the reverse biased diodes may be combined with the series inductance 42 of matching section 32 to provide a low pass filter is illustrated in FIGS. 4 and 5. For simplicity of illustration FIG. 4 represents a 4-throw switch with one diode thereof biased in the forward direction and the remaining diodes reverse biased. It can be seen from FIG. 4 that the series inductance 35 of the forward biased diode and the equivalent shunt capacitance 46 (and including the junction and case capacitance) of the reverse biased diodes are connected to common terminal 22. Capacitance 46 in turn may be combined to provide a shunt capacitance 48 to ground and in conjunction with inductances 35 and 42 provide a low-pass T-section filter as shown in FIG. 5. The individual series diode resistance and the load resistance for the reverse biased diodes, effectively connected in parallel, have a sufficiently low value to be considered negligible in the equivalent filter network. Thus, by selectively biasing one diode in the forward direction and the remaining diodes in the reverse direction, a low pass filter including an input matching section and the diode impedances is provided for coupling the common or input port of the switching arrangement to the associated selected one of output ports 16.

The characteristic impedance $Z_0$ of the equivalent input and output transmission lines may be expressed by:

$$Z_0 \cong \sqrt{\frac{Lw}{C_T}}$$

where $Lw$ is the series inductance of the "on" diode and $C_T$ is the total shunt capacitance of the "off" diodes. Matching between input and output can be achieved by making the effective inductance ($Lm$) presented by section 20b of center conductor 20 approximately equal to the series inductance of the forward biased diode so that $Lw=Lm$. For such an arrangement the cutoff frequency $F_c$ of the low pass filter may be expressed by:

$$F_c \cong \frac{1}{2\pi\sqrt{\frac{LwC_T}{2}}}$$

In a 16 to 1 multi-throw switch constructed according to the foregoing, and utilizing computer type switching diodes matched to 50 ohm input and output transmission lines, it is possible to achieve an insertion loss of less than 1 db, as well as a 1.3 (max.) input VSWR and more than 27 db isolation of the "off" ports over a frequency band of 750 megacycles. The "on" diode require +60 ma. current, and the "off" diodes −20 v.d.c.

Figure 6:
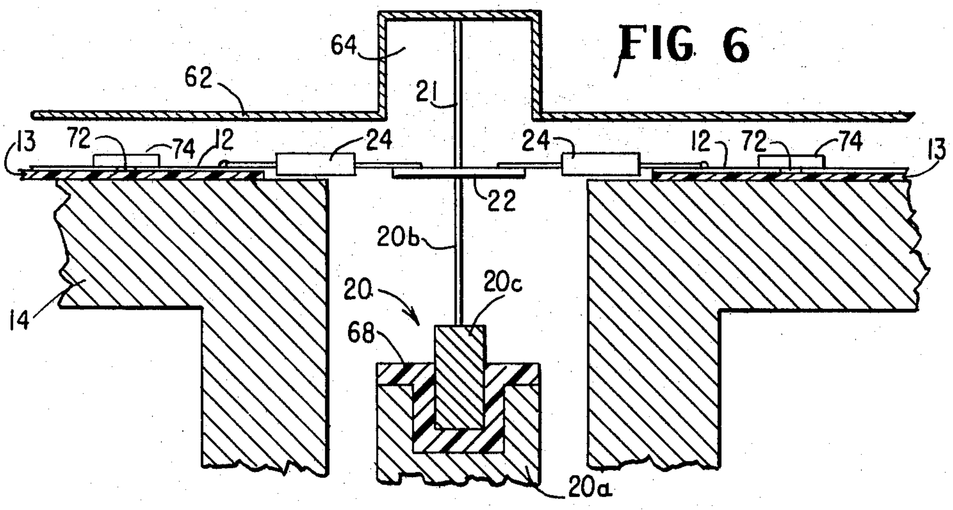
FIG. 6 is a cross-sectional view of another multi-throw diode switch which embodies the invention.

FIG. 6 represents another embodiment of the invention wherein a bandpass filter is provided to couple the common or input port to an output selected port. The second ground plane or cover plate 62 is provided over the assembled switching arrangement and includes a cylindrical cavity 64 positioned coaxially above common terminal 22. The short section of line 21, coaxial with the walls of cavity 64, provides an inductance between common terminal 22 and ground plane 62. A series capacitance is provided in the signal path along conductors 12 from each diode to its associated output port 16. This may be accomplished, for example, by providing a gap 72 in conductor 12 and bridging the gap with a ceramic or glass wafer capacitor 74. Alternately, this capacitance may be provided by making gap 72 sufficiently large to provide the desired series capacitance in conductors 12. A further series capacitor is provided in center conductor 20. This may be achieved by breaking center conductor 20 and inserting a cup-shaped dielectric 68 such as Teflon in section 20a. An intermediate section 20c joins the interior of cup-shaped dielectric 68 with inductive matching section 20b. This provides relatively large area to obtain the desired capacitance.

Figure 7:
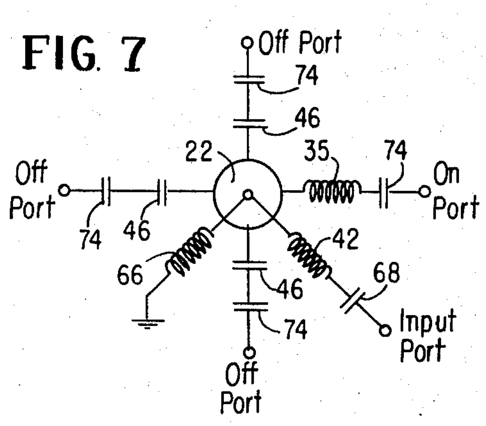
FIGS. 7 and 8 are equivalent circuits of a single pole, 4 throw switch showing the manner in which the diode capacitance and inductance are incorporated into a band pass filter network.

The equivalent circuit of a 4-throw switch constructed according to FIG. 6 is illustrated in FIG. 7. Each of the reverse biased diodes of the path coupled to the "off" ports is represented by capacitance 46, and is effectively in series with the capacitance 74 inserted in each conductor 12. The forward biased or "on" port is represented by diode series inductance 35, and is in series with capacitance 74. Common terminal 22 is coupled to the common or input port by inductance 42 (provided by line section 20b), and capacitance 68 (provided by the insulating cup disposed between line sections 20a and 20c). Typically, capacitance 68 is made equivalent to capacitance 74, and inductance 42 is made equivalent to inductance 35. Common terminal 22 is also coupled to ground reference potential by the inductance 66 of line section 21.

Figure 8:
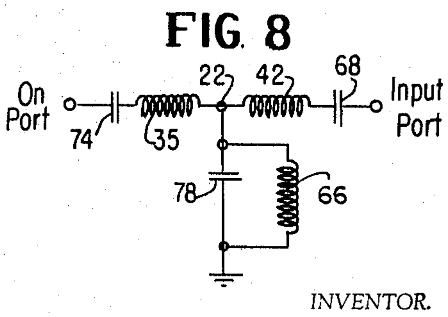

The manner in which the equivalent circuit of FIG. 7 is incorporated into a bandpass filter network is illustrated in FIG. 8. Common terminal 22 is shunted to ground reference potential by capacitance 78, representing the sum of capacitances 46 and 74 for all the "off" ports. Capacitance 78 is also shunted by inductance 66 to provide a parallel resonance path to ground. Inductor 42, in series with capacitance 68, joins common terminal 22 with the input port, while capacitor 74 and inductor 35 joins common point 22 with the output port associated with the forward biased diode. By making capacitors 68, 74 and inductors 32, 44 approximately equal and in series resonance the circuit illustrated in FIG. 8 provides a bandpass T-section filter for matched coupling between the common or input port and the output port associated with the forward biased diode of the switching arrangement.

The invention provides therefore a fast-acting 1:N multi-throw diode switch for broadband high frequency applications. By incorporating the diode inductance and capacitances into a filter network such as a low-pass or bandpass T-section filter the insertion loss and voltage standing wave ratio may be minimized over a wide range of operating frequencies. A large number of switch positions can be incorporated into a simple, compact structure, and reliable, high speed operation is obtainable by the expenditure of low operating power.

I claim:

1. A switching network for completing a propagation path for electrical waves between a first port and a selected one of a plurality of other ports, said network including a common terminal, a plurality of semiconductor diodes each connected between one of said other ports and said common terminal, said diodes being adapted to be biased to alternate conductive states, with one state being transmissive and the other state being reflective to applied electrical waves, biasing means coupled to said diodes for rendering a selected diode transmissive to electrical waves and the remaining diodes reflective thereto, said selected transmissive diode presenting an equivalent series inductance to electrical waves and said reflective diodes providing shunt capacitance to a reference potential for such waves, and a transmission line section connecting said common terminal to said first port, said transmission line section having an effective inductance approximately equal to the equivalent series inductance of a transmissive diode, said equivalent series inductance of the selected transmissive diode and said effective inductance cooperating with the shunt capacitance of the remaining reflective diodes to form a filter network which provides a matched transmission path between said first port and the one of said other ports to which the transmissive diode is coupled.

2. A high frequency switching network for completing a wave propagation path between an input port and a selected one of a plurality of output ports, said network including a common terminal, a plurality of conductors each connected to one of said output ports, a crystal diode connected between each one of said conductors and said common terminal, said diodes adapted to be biased to alternate states, with one state being transmissive to wave propagation and the other state being reflective to wave propagation, means coupled to said diodes for rendering a selected diode transmissive to wave propagation and rendering the remaining diodes reflective to wave propagation, said selected transmissive diode presenting a first inductance in said wave propagation path and said reflective diodes providing shunt capacitance to a reference potential for said propagated wave, and an impedance matching section of transmission line connecting said common terminal to said output port, said matching section presenting a second inductance in said wave propagation path substantially equal to said first inductance of said transmissive diode, said shunt capacitance of said reflective diodes being combined with said first and second inductances to provide a T-section low pass filter network, thereby providing a matched transmission path for said wave between said input port and said output port over a wide frequency band.

3. A high frequency switching network for completing a wave propagation path between an input port and a selected one of a plurality of output ports, said network including a common terminal, a conductor connected to each of said output ports and extending therefrom, a crystal diode connected between each one of said conductors and said common terminal, said diodes adapted to be biased to alternate conductive states, with one state being transmissive and the other state being reflective to propagated waves, biasing means coupled to said diodes for rendering a selected diode transmissive to propagated waves and the remaining diodes reflective to propagated waves, said selected transmissive diode presenting an equivalent series inductance to propagated waves and said reflective diodes providing shunt capacitance to a reference potential for propagated waves, and a length of coaxial line connecting said common terminal to said input port, said coaxial line including a high impedance matching section having an effective inductance approximately equal to the equivalent series inductance of a transmissive diode, said diode equivalent series inductance and said effective inductance being incorporated with the shunt capacitance of the remaining reflective diodes to provide a matched transmission path between said input port and selected output ports over a wide frequency band.

4. A high frequency switching network for completing a wave propagation path between an input port and a selected one of a plurality of output ports, said network including a common terminal, a plurality of conductors each connected to one of said output ports, a crystal diode connected between each one of said conductors and said common terminal, said diodes adapted to be biased into two alternate conductive states, with one state being transmissive to wave propagation and the other state being reflective to wave propagation, biasing means coupled to said diodes for rendering a selected diode transmissive to wave propagation and rendering the remaining diodes reflective to wave propagation, said selectively biased transmissive diode presenting a series inductance to said wave propagation path and the remaining reflective diodes providing shunt capacitance to a reference potential for said propagated wave, transmission line means coupling said common terminal to an output port, and a low pass T-section filter network in the propagation path between said input port and the output port associated with a diode selectively biased to be transmissive to wave propagation, said filter network including first and second series arms comprising the series inductance of said transmissive diode and a high impedance matching section in said transmission line having an effective inductance approximately equal to said diode series inductance, and a shunt arm comprising the effective capacitance of the remaining reflective diodes coupled between said common terminal and a reference potential.

5. A high frequency switching network for completing a wave propagation path between an input port and a selected one of a plurality of output ports, said network including a common terminal, a plurality of conductors each connected to a different one of said output ports, a crystal diode connected between each one of said conductors and said common terminal, said diodes adapted to be biased into alternate conductive states, one state being transmissive to wave propagation and the other state being reflective to wave propagation, biasing means coupled to said diode for rendering a selected diode transmissive to wave propagation and the remaining diodes reflective to wave propagation, said selected transmissive diode presenting an effective series inductance to said wave propagation path and the remaining reflective diodes providing shunt capacitance to a reference potential for said propagated wave, transmission line means coupling said common terminal to an output port, and a filter network in the wave propagation path between said input port and the output port associated with said diode selectively biased to be transmissive to wave propagation, said filter network comprising first and second series arms and a shunt arm, said first series arm including said equivalent series inductance of said transmissive diode, said second series arm including a high impedance matching section in said transmission line means having an effective inductive approximately equal to said diode equivalent series inductance, and said shunt arm including the effective capacitance of the remaining diodes biased to be reflective to said propagated wave.

6. A single pole multi-throw switching network including in combination, a ground plane having an aperture at the center thereof, a plurality of output ports disposed around the periphery of said ground plane, dielectric means disposed on one major surface of said ground plane, a plurality of conductors disposed on said dielectric means and extending between said output ports and the outer periphery of said center aperture, a common terminal disposed in said center aperture and insulated from said ground plane, further conductor means coaxial with said center aperture connecting said common terminal to an input port, said further conductor means including a matching section providing series inductance for said propagated wave, and a crystal diode connecting said common terminal to each of said plurality of conductors, said diodes adapted to be biased into alternate conductive states, with one conductive state being transmissive to wave propagation and the other conductive state being reflective to wave propagation, and with a selectively biased transmissive diode presenting an effective series inductance to wave propagation and the remaining reflective diodes providing shunt capacitance to said ground plane for said propagated wave, said diode equivalent series inductance and said shunt capacitance being combined with said matching section of line to provide a low pass T-section filter network to produce a matched propagation path for said wave between said input port and a selected output port over a wide frequency band.

7. A single pole multi-throw switching network including in combination, a disc-shaped ground plane having an aperture at the center thereof, a plurality of output ports disposed around the outer periphery of said ground plane, a dielectric sheet disposed on one major surface of said ground plane, a plurality of conductors disposed on said dielectric sheet and extending radially inwardly from each of said output ports to the outer periphery of said center aperture, a common terminal disposed coaxially within said aperture and insulated from said ground plane, a further conductor normal to the major surfaces of said ground plane and disposed coaxial of said aperture connecting said common terminal to an input port, said further conductor including an inductive matching section of line, and a crystal diode connecting said common terminal to each of said plurality of conductors, said diodes adapted to be biased in two alternate states, with one state being transmissive to wave propagation and the other state being reflective to wave propagation, with a selected transmissive diode presenting an effective series inductance to wave propagation and the remaining reflective diodes providing shunt capacitance to said ground plane for said propagated wave, said diode equivalent inductance and said shunt capacitance being combined with said matching section of line to provide a filter network to provide a matched propagation path for said wave between said input port and a selected output port over a wide frequency band.

8. A single pole multi-throw switching network including in combination, a first ground plane having an aperture at the center thereof, a plurality of output ports disposed around the outer periphery of said first ground plane, a dielectric sheet disposed on one major surface of said first ground plane, a plurality of conductive paths on said dielectric sheet and extending from said output ports to the outer periphery of said center aperture, said conductive paths including series capacitance means, a common terminal disposed coaxially within said aperture and insulated from said first ground plane, a second ground plane in spaced relation from said first ground plane, inductance means coupling said common terminal to said second ground plane, further conductive path disposed coaxially of said center aperture connecting said common terminal to an input port, said further conductive path including series inductance and series capacitance means, and a crystal diode connecting said common terminal to each of said plurality of conductive paths, said diodes adapted to be biased in two alternate conductive states, one state being transmissive to wave propagation and the other state being reflective to wave propagation, with a selectively biased transmissive diode presenting an effective series inductance to wave propagation and the remaining reflective diodes providing shunt capacitance to said first ground plane for said propagated wave, whereby a bandpass filter network is provided to provide a matched propagation path for said wave between said input port and a selected output port over a wide frequency band.

9. A single pole multi-throw switching network including in combination, a first disc-shaped ground plane having an aperture at the center thereof, a plurality of output ports disposed around the outer periphery of said first ground plane, a dielectric sheet disposed on one major surface of said first ground plane, a plurality of conductive paths on said dielectric sheet and extending radially from said output ports to the outer periphery of said center aperture, said conductive paths including first and second conductor members with series coupling means therebetween, a common terminal disposed coaxially within said center aperture and insulated from said first ground plane, a second ground plane positioned in spaced relation from said first ground plane, a first section of coaxial line providing an inductive reactance coupling said common terminal to said second ground plane, a second section of coaxial line disposed coaxial of said center aperture connecting said common terminal to an input port, said second section of coaxial line including series capacitance means and a matching section providing an inductive reactance, and a crystal diode connecting said common terminal to each of said plurality of conductive paths, said diodes adapted to be biased to two alternate states, one state being transmissive to wave propagation and the other state being reflective to wave propagation, and with a selected transmissive diode presenting an effective series inductance to wave propagation and the remaining reflective diodes providing shunt capacitance to said ground plane for a wave propagation, said diode equivalent inductance and said shunt capacitance being combined with said conductive paths and said coaxial lines to form a bandpass filter network to provide a matched propagation path for said wave between said input port and a selected output port over a given frequency band.

References Cited by the Examiner

UNITED STATES PATENTS 3,131,365 4/1964 Hoover ---------------- 333—7

OTHER REFERENCES

Ravenhill et al.: "Five New Diode Circuits for Nanosecond Microwave Switching," Electronics, Aug. 31, 1962, pp. 37 to 39.

HERMAN KARL SAALBACH, *Primary Examiner.*